(12) United States Patent
Koo et al.

(10) Patent No.: US 10,025,724 B1
(45) Date of Patent: Jul. 17, 2018

(54) ADDRESS MAPPING METHOD OF MEMORY SYSTEM

(71) Applicant: SK hynix Inc., Gyeonggi-do (KR)

(72) Inventors: Ja-Hyun Koo, Gyeonggi-do (KR);
Jong-Hyun Park, Gyeonggi-do (KR);
Seung-Gyu Jeong, Gyeonggi-do (KR);
Jung-Hyun Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/664,259

(22) Filed: Jul. 31, 2017

(30) Foreign Application Priority Data

Jan. 11, 2017 (KR) .................. 10-2017-0004237

(51) Int. Cl.
*G11C 8/00* (2006.01)
*G06F 12/1009* (2016.01)
*G11C 13/00* (2006.01)

(52) U.S. Cl.
CPC ........ *G06F 12/1009* (2013.01); *G11C 13/004* (2013.01); *G11C 13/0004* (2013.01); *G11C 13/0023* (2013.01); *G11C 13/0069* (2013.01); *G06F 2212/65* (2013.01)

(58) Field of Classification Search
CPC ....... H01L 25/0657; H01L 2225/06555; G06F 2212/65; G06F 13/1663; G06F 2212/202; G06F 12/1009
See application file for complete search history.

(56) References Cited

U.S. PATENT DOCUMENTS

| | | | |
|---|---|---|---|
| 2010/0100667 A1* | 4/2010 | Kang | G06F 12/0246 711/103 |
| 2014/0095827 A1 | 4/2014 | Wei et al. | |
| 2014/0185611 A1* | 7/2014 | Lie | H04L 49/25 370/355 |
| 2017/0160959 A1* | 6/2017 | Wang | G06F 12/02 |

FOREIGN PATENT DOCUMENTS

KR 101533744 7/2015

* cited by examiner

*Primary Examiner* — Uyen B Tran
(74) *Attorney, Agent, or Firm* — IP & T Group LLP (57) ABSTRACT

Disclosed is an address mapping method of a memory system. The address mapping method may include grouping adjacent memory cells into multiple cubes, from a plurality of memory cells respectively located at intersections of a plurality of row lines and a plurality of column lines; allocating most significant bit (MSB) N bits of a physical address for identifying the cubes; allocating least significant bit (LSB) M bits of the physical address for designating locations of memory cells included in each of the cubes, M and N being positive integers; storing information about a mapping between a logical address and the (M+N)-bit physical address in a mapping table; and when the logical address in response to an external request is received, translating the logical address to the physical address based on the mapping table.

20 Claims, 8 Drawing Sheets

| MEMORY CELL | PHYSICAL ADDRESS |
|---|---|
| MC1 | XXXXXXX 000 |
| MC2 | XXXXXXX 101 |
| MC3 | XXXXXXX 110 |
| MC4 | XXXXXXX 011 |
| MC5 | XXXXXXX 100 |
| MC6 | XXXXXXX 001 |
| MC7 | XXXXXXX 010 |
| MC8 | XXXXXXX 111 |

ADDRESS MAPPING METHOD OF MEMORY SYSTEM

CROSS-REFERENCE TO RELATED APPLICATION

The present application claims priority of Korean Patent Application No. 10-2017-0004237, filed on Jan. 11, 2017, which is incorporated herein by reference in its entirety.

BACKGROUND

1. Field

Exemplary embodiments of the present invention relate to a semiconductor design technology and, more particularly, to an address mapping method of a memory system.

2. Description of the Related Art

Recently, extensive research is being carried out for developing the next-generation memory devices which will replace dynamic random-access memory (DRAM) and flash memory. A next-generation memory device which is under extensive development at the present time is a resistive memory device which uses a material whose resistance may, in response to a bias applied thereto, switch between at least two different resistance states. Such materials are called variable resistance materials. Representative examples of resistive memory devices may include resistive random-access memory (RRAM), phase-change random access memory (PCRAM), magnetoresistive random access memory (MRAM) and ferroelectric random-access memory (FRAM or FeRAM).

A resistive memory device may configure a memory cell array to have a cross-point array structure in which a plurality of lower electrodes (e.g., a plurality of row lines (or word lines)) and a plurality of upper electrodes (e.g., a plurality of column lines (or bit lines)) cross over each other and memory cells are disposed at the intersections of the plurality of lower electrodes and the plurality of upper electrodes, respectively. Each of the memory cells may have a variable resistance element and a selection element coupled in series thereto.

A resistive memory device may be subject to a drift phenomenon in which data is lost when the resistance value of data written in a memory cell changes over time after the data is written in the memory cell. Accordingly, the resistive memory device needs to secure the time that the resistance level of a memory cell reaches to enter a target window after data is written in the memory cell. In other words, the resistive memory device needs to secure a data recovery time.

If the same row address or column address is consecutively inputted, however, that is, if the same word line or bit line is consecutively accessed within the same cell mat, an access time for a target memory cell is influenced by the data recovery time. More specifically, if the column addresses of memory cells having the same row address are increased one by one or the row addresses of memory cells having the same column address are increased one by one in an incremental address decoding scheme, it is necessary to secure the data recovery time of a previously accessed memory cell whenever each memory cell is accessed. Accordingly, the time that is taken for an operation of accessing a memory cell is increased.

SUMMARY

Various embodiments are directed to a memory system capable of mapping the addresses of memory cells in a cube unit.

In an embodiment, an address mapping method of a memory system may include Disclosed is an address mapping method of a memory system. The address mapping method may include grouping adjacent memory cells into multiple cubes, from a plurality of memory cells respectively located at intersections of a plurality of row lines and a plurality of column lines; allocating most significant bit (MSB) N bits of a physical address for identifying the cubes; allocating least significant bit (LSB) M bits of the physical address for designating locations of memory cells included in each of the cubes, M and N being positive integers; storing information about a mapping between a logical address and the (M+N)-bit physical address in a mapping table; and when the logical address in response to an external request is received, translating the logical address to the physical address based on the mapping table.

In an embodiment, a memory system may include a controller suitable for translating a logical address to an (M+N)-bit physical address based on mapping information, M and N being positive integers; and a memory device including a plurality of memory cells respectively located at intersections of a plurality of row lines and a plurality of column lines, suitable for performing a read/write operation on memory cells corresponding to the physical address, wherein the controller comprises: an address mapping module suitable for grouping adjacent memory cells from the plurality of memory cells into multiple cubes, allocating most significant bit (MSB) N bits of the physical address for identifying the cubes, and allocating least significant bit (LSB) M bits of the physical address for designating locations of memory cells included in each cube; and a mapping table suitable for storing the mapping information between the logical address and the physical address.

In an embodiment, a memory system may include a controller suitable for translating a logical address to a first physical address; and a memory device including a plurality of memory cells respectively located at intersections of a plurality of row lines and a plurality of column lines, suitable for remapping the first physical address to a second physical address based on mapping information, and performing a read/write operation on memory cells among the plurality of memory cells corresponding to the second physical address, wherein the memory device comprises: an address mapping module suitable for grouping adjacent memory cells from the plurality of memory cells into multiple cubes, allocating most significant bit (MSB) N bits of the second physical address for identifying the cubes, and allocating least significant bit (LSB) M bits of the second physical address for designating locations of memory cells included in each cube; and a mapping table suitable for storing the mapping information between the first logical address and the second physical address.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, in the described embodiments of the present invention, a PCRAM will be described as an example. It is noted that the present invention may be applied to all non-volatile memory devices which employ a resistive material, such as, for example, a resistive RAM (RRAM) and a ferroelectric RAM (FRAM).

Figure 1:
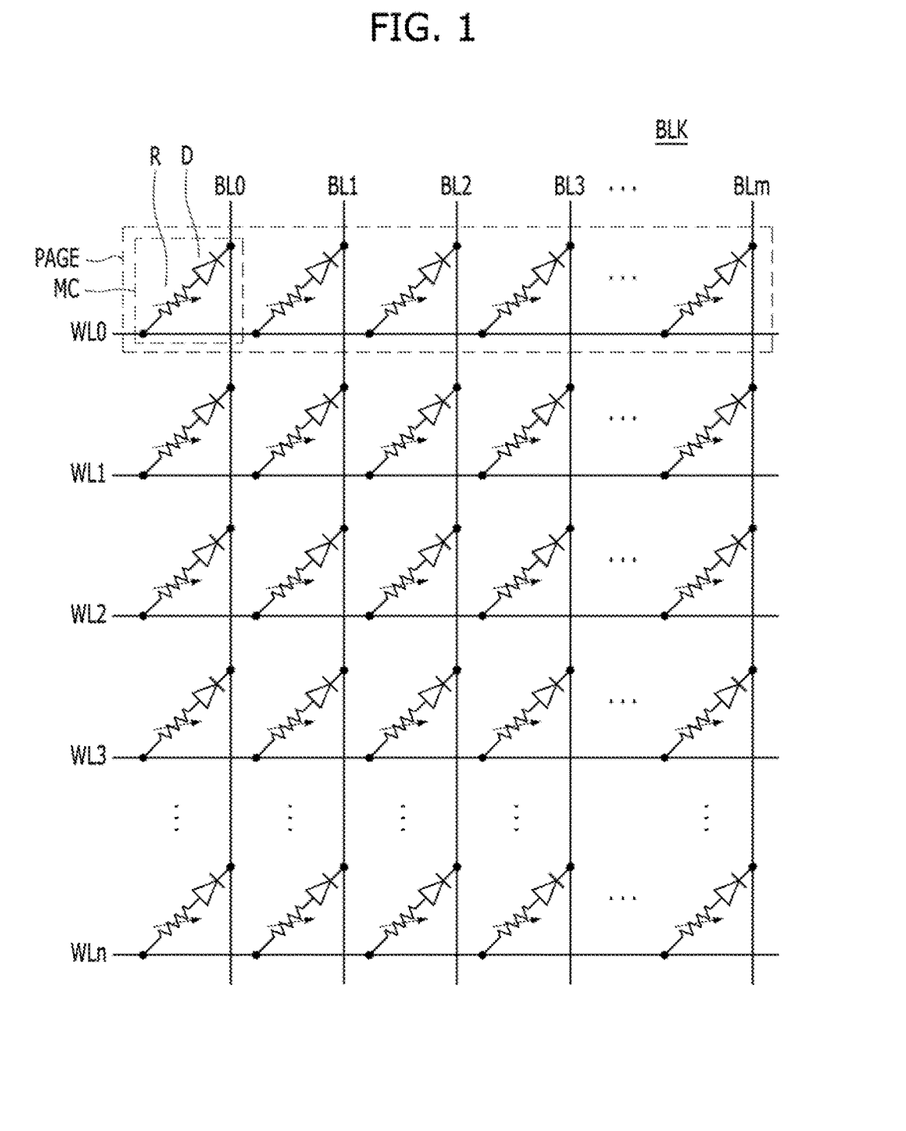
FIG. 1 is a diagram schematically showing a memory cell array of a phase-change random access memory (PCRAM) device.

FIG. 1 is a diagram schematically showing a memory cell array of a phase-change random access memory (PCRAM) device.

Referring to FIG. 1, the memory cell array may include a plurality of memory cell regions. The memory cell region indicative of a set of memory cells may be defined in various manners. For example, when the PCRAM device includes a plurality of memory blocks, FIG. 1 shows memory cells included in one memory block BLK. A single block BLK may include a plurality of pages in each of which memory cells MC coupled to the same word line are defined.

The block BLK may include a plurality of the memory cells MC respectively located at the intersections of a plurality of word lines WL0 to WLn and a plurality of bit lines BL0 to BLm. Each of the plurality of memory cells MC may include a resistive memory element R and a selection element D. In this case, the resistive memory element R may also be called a variable resistance element or a variable resistance material. The selection element D may also be called a switching element.

The resistive memory element R may have a low resistance state corresponding to a set state, or a high resistance state corresponding to a reset state, depending on data stored therein. The resistive memory element R may be a phase-change memory element. The resistive memory element R may have a low resistance value if it is a crystalline state, and may have a high resistance value if it is an amorphous state. The phase of such a phase-change material may be changed by Joule heating. The amount of heat generated depends on the amount of current. Furthermore, data may be written using such a phase change.

Figure 2:
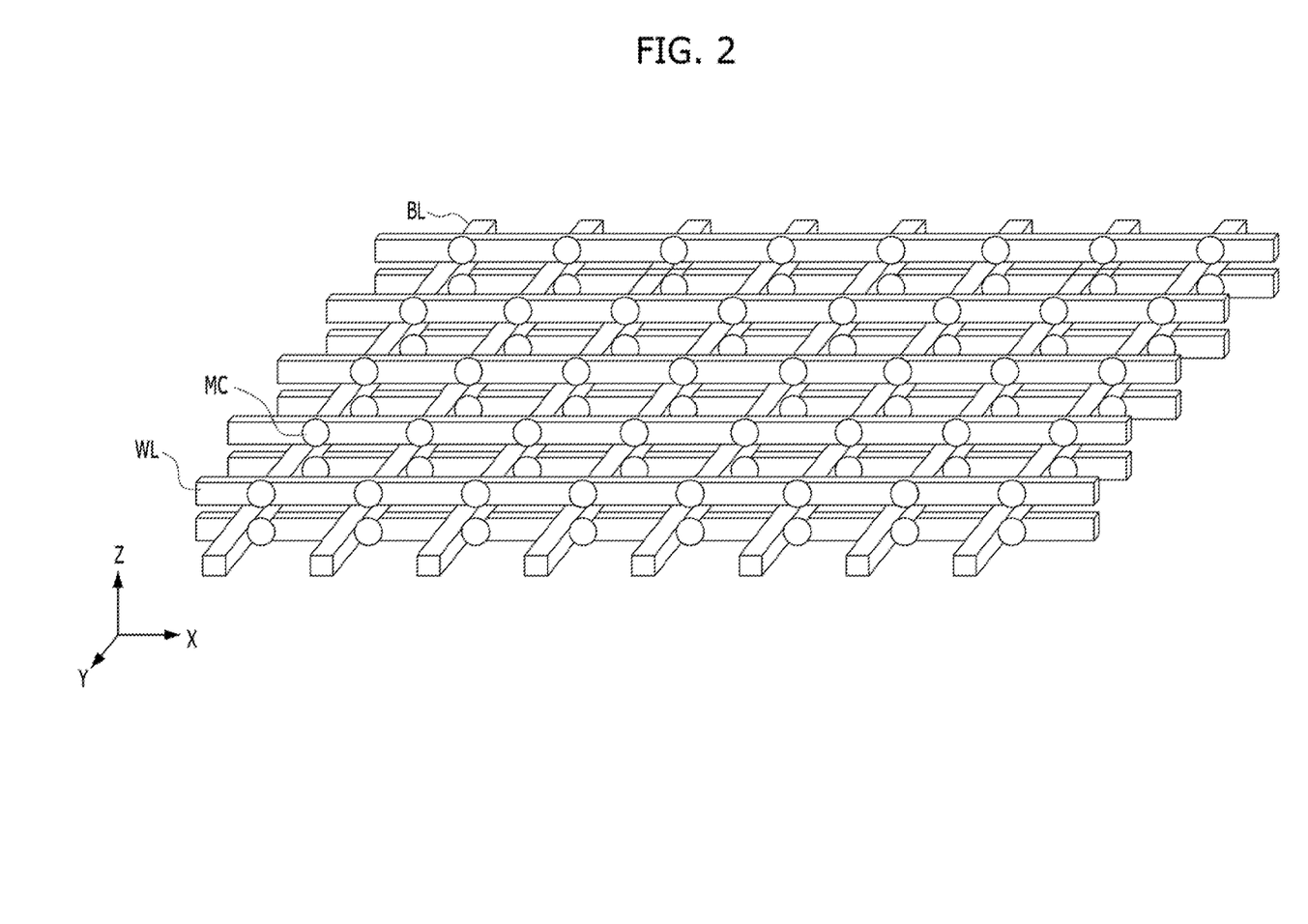
FIG. 2 is a diagram showing a memory cell array of a phase-change random access memory (PCRAM) device having a three-dimensional (3D) structure in accordance with an embodiment of the present invention.

FIG. 2 is a diagram showing a memory cell array of a phase-change random access memory (PCRAM) device having a three-dimensional (3D) structure in accordance with an embodiment of the present invention.

Referring to FIG. 2, one block BLK of the memory cell array may include a cross-point array, including a plurality of first conductive lines (i.e., a plurality of row lines (or word lines WL)), a plurality of second conductive lines (i.e., a plurality of column lines (or bit lines BL)), and a plurality of memory cells MC. Each of the plurality of first conductive lines is extended in a first direction (i.e., an X direction). The plurality of first conductive lines are arranged in a second direction (i.e., a Y direction) at a regular interval. The plurality of first conductive lines are stacked in a third direction (i.e., a Z direction) at a regular interval. The regular intervals in the second and third directions may be the same or different. Preferably, as illustrated in the embodiment of FIG. 2, the interval between two consecutive word lines WL stacked in the Z direction may be smaller than the interval between two consecutive word lines WL in the Y direction and may be defined by the vertical (e.g., the Z direction) height of the bit lines. Each of the plurality of second conductive lines is extended in the Y direction between word lines adjacent in the Z direction and are arranged in the X direction at a regular interval. The regular interval in the X direction at which the plurality of bit lines are arranged may be the same or different to the regular interval at which the word lines are arranged in the Y direction. Each of the plurality of memory cells MC is located at the intersections of the plurality of word lines WL and the plurality of bit lines BL. The X, Y and Z directions may be orthogonal to each other.

In one embodiment of the present invention, the plurality of word lines WL may have a 3D structure in which they are stacked in the Z direction. That is, two word lines WL may be stacked in the Z direction to form a pair and a plurality of the bit lines BL may be arranged in the X direction between a pair of adjacent word lines in the Z direction. In FIG. 2, a pair of word lines WL, that is, two word lines WL, have been illustrated as being stacked in the Z direction, but the present invention is not limited thereto. For example, two or more pairs of word lines WL may be stacked in the Z direction with a plurality of bit lines BL arranged in the X direction between each pair of the word lines WL.

Figure 3:
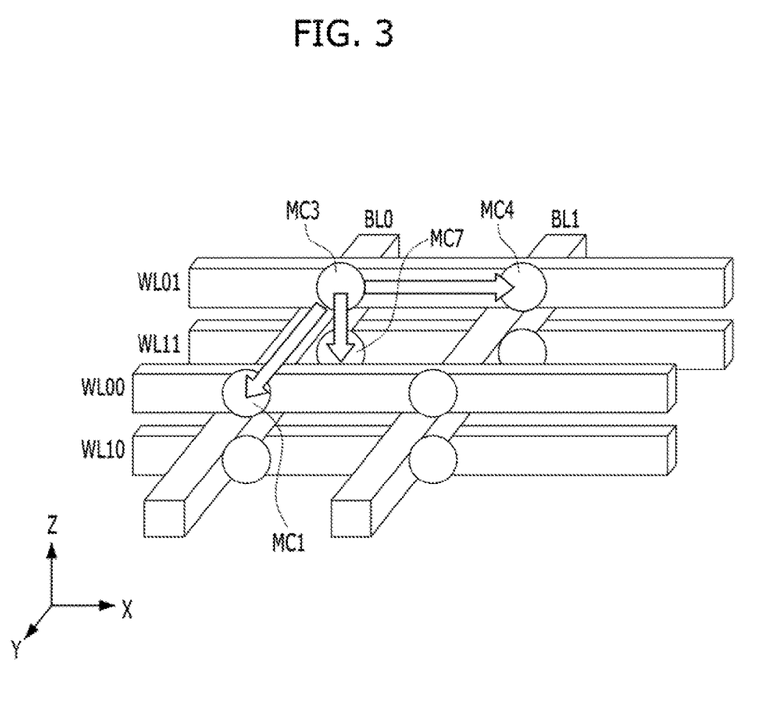
FIG. 3 is a diagram illustrating an example in which the same word line or bit line is consecutively accessed in a memory cell array of FIG. 2.

FIG. 3 is a diagram illustrating an example in which the same word line WL or bit line BL is consecutively accessed in a memory cell array in accordance with an embodiment of the present invention, for example, the memory cell array of FIG. 2.

Referring to FIG. 3, in the memory cell array having the 3D structure of FIG. 2, if the same word line WL or bit line BL is consecutively accessed, an access time for a target memory cell is influenced by a data recovery time. For example, if a fourth memory cell MC4 coupled to the same word line (i.e., a second word line WL01) is accessed after a third memory cell MC3 located at the intersection of the second word line WL01 and a first bit line BL0 is accessed, the access to the fourth memory cell MC4 may be performed after a data recovery time from the access to the third memory cell MC3 passes. Alternatively, if a first memory cell MC1 or a seventh memory cell MC7 coupled to the same bit line (i.e., the first bit line BL0) is accessed after the third memory cell MC3 is accessed, the access to the first memory cell MC1 or the seventh memory cell MC7 may be performed after a data recovery time from the access to the first memory cell MC1 passes.

More specifically, in the incremental address decoding scheme, if the column addresses of memory cells having the same row address are increased one by one or if the row addresses of memory cells having the same column address are increased one by one, the time required for an operation of accessing a memory cell is increased because the data recovery time of a previously accessed memory cell needs to be secured whenever each memory cell is accessed.

A detailed method for reducing the time taken for an operation of accessing a memory cell by mapping the addresses of memory cells in a cube unit in accordance with an embodiment of the present invention is described below.

Figure 4:
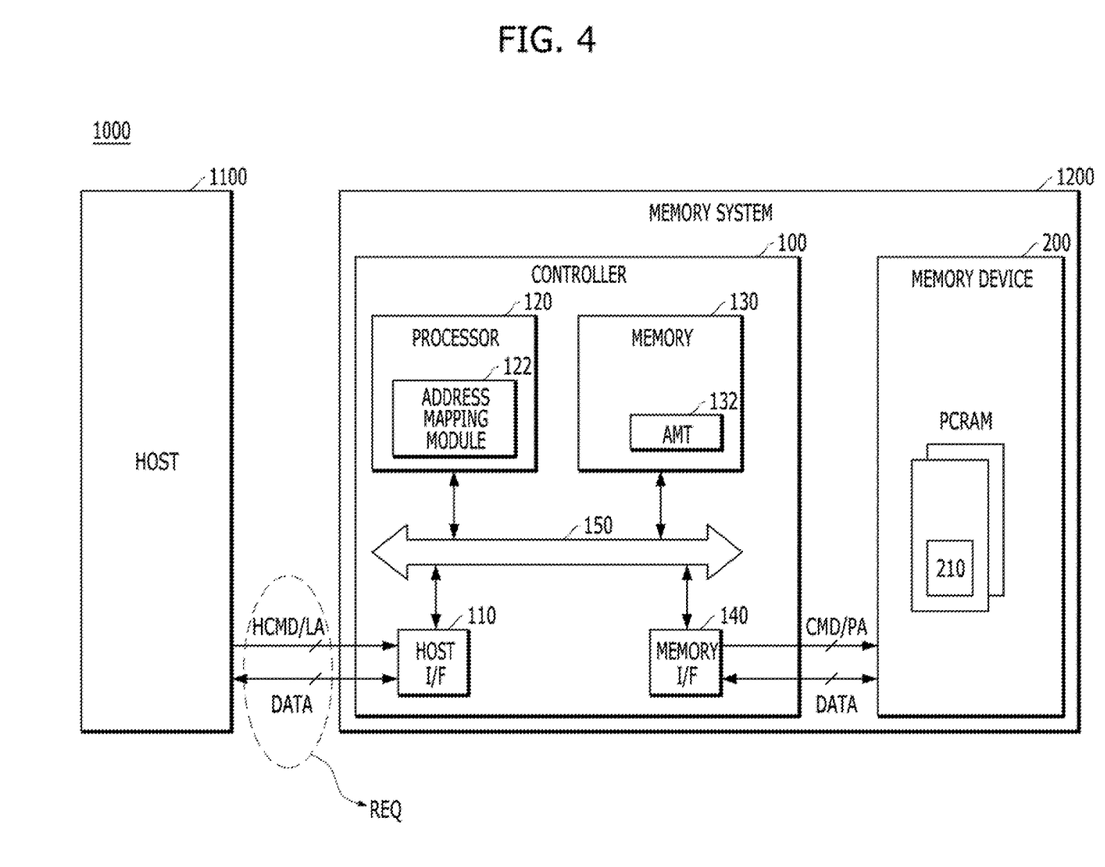
FIG. 4 is a block diagram illustrating a data processing system including a memory system in accordance with an embodiment of the present invention.

FIG. 4 is a block diagram illustrating a data processing system 1000 including a memory system 1200 in accordance with an embodiment of the present invention.

Referring to FIG. 4, the data processing system 1000 may include a host 1100 and the memory system 1200.

The host 1100 may execute various computing functions, such as performing specific calculation and/or tasks, or may execute various application programs, such as an operating system (OS) and/or applications. Although not shown, the host 1100 may be implemented to include a processor, a main memory, a bus and so on.

The memory system 1200 may perform a program, a read or an erase operation according to a request REQ from the host 1100. The memory system 1200 may be used as the main storage device or auxiliary storage device of the host 1100.

The memory system 1200 may include a controller 100 and a memory device 200.

The memory device 200 may include at least one phase-change random access memory (PCRAM). The PCRAM may include a memory cell array 210 including a plurality of memory cells (not shown) respectively located at the intersections of a plurality of word lines (not shown) and a plurality of bit lines (not shown). In some embodiments, the memory cell array 210 may be a memory cell array having the 3D structure as shown in FIG. 2. The memory device 200 may select a memory cell in which data is to be written by selecting one of a plurality of word lines and one of a plurality of bit lines based on a physical address PA transferred by the controller 100.

The controller 100 may control an overall operation of the memory device 200 in response to a request REQ from the host 1100. For example, the controller 100 may write data DATA received from the host 1100 in a memory cell of the memory device 200 corresponding to a logical address LA in response to a command HCMD from the host 1100. For another example, the controller 100 may read data requested by the host 1100 from a memory cell of the memory device 200 corresponding to a logical address LA and send the read data DATA to the host 1100, in response to a command HCMD from the host 1100.

The controller 100 may generate a physical address PA and a command CMD for controlling the memory device 200 based on the command HCMD and logical address LA received from the host 1100. That is, the controller 100 may translate the logical address LA, transferred by the host 1100, into the physical address PA, and may provide the translated physical address PA to the memory device 200. For reference, the physical address PA may include information indicative of a physical location of the memory cell array 210 in which data is to be written. Accordingly, the controller 100 may control the program, read or erase operation of the memory device 200 by providing a physical address PA and a command CMD to the memory device 200. Furthermore, data DATA for a program operation and read data DATA may be transmitted/received between the controller 100 and the memory device 200 or between the controller 100 and the host 1100.

The controller 100 may include a host interface (I/F) 110, a processor 120, a memory 130, a memory interface (I/F) 140 and a bus 150.

The host I/F 110 may perform interfacing between the host 1100 and the controller 100, and may be configured to communicate with the host 1100 through at least one of various interface protocols, such as a universal serial bus (USB), a multi-media card (MMC), peripheral component interconnect express (PCI-e), a serial-attached SCSI (SAS), serial advanced technology attachment (SATA), parallel advanced technology attachment (PATA), a small computer system interface (SCSI), an enhanced small disk interface (ESDI) and integrated drive electronics (IDE).

The processor 120 may control an operation of the memory system 1200, including for example, at least one of a program, read or erase operation of the memory device 200 in response to a request REQ received from the host 1100. The processor 120 may be implemented using a microprocessor or a central processing unit (CPU).

The processor 120 may include an address mapping module 122 configured to receive a logical address LA from the host 1100 and to map the logical address LA to a physical address PA of (M+N) bits (where M and N are positive integers) based on mapping information. The address mapping module 122 may group adjacent memory cells into a cube unit, may allocate most significant bit (MSB) N bits of a physical address PA so as to identify the grouped cubes, and may allocate least significant bit (LSB) M bits of the physical address PA so as to designate the locations of memory cells included in each cube. In this case, the number of memory cells within one cube may be smaller than or equal to $2^M$. A number obtained by dividing a total number of memory cells by the number X of memory cells within one cube may be smaller than or equal to $2^N$. In some embodiments, M may be a positive integer greater than or equal to 3.

The memory 130 may be the operation memory of the memory system 1200 and the controller 100 and may store data for the driving of the memory system 1200 and the controller 100. That is, the memory 130 may store data necessary to perform an operation, such as a data write operation or a data read operation, between the host 1100 and the memory device 200. The memory 130 may include a program memory, a data memory, a write buffer and a read buffer in order to store such data. The memory 130 may be implemented using a volatile memory, such as a static random access memory (SRAM) or a dynamic random access memory (DRAM).

The memory 130 may include an address mapping table (AMT) 132 configured to store information about the mapping between a logical address LA provided by the host 1100 and a physical address PA provided to the memory device 200. The mapping information of the AMT 132 may be stored in a specific region (e.g., a meta region) of the memory cell array 210 of the memory device 200. When the memory system 1200 is powered on, mapping information stored in the memory cell array 210 may be loaded onto the AMT 132.

The memory I/F 140 may perform interfacing between the controller 100 and the memory device 200 in order for the controller 100 to control the memory device 200 in response to a request REQ received from the host 1100.

The host I/F 110, the processor 120, the memory 130 and the memory I/F 140 may be operatively couple to exchange data and control signals through a bus 150.

Although not shown, the controller 1100 may be implemented to further include an error correction code (ECC) module and/or a power management module.

Figure 5:
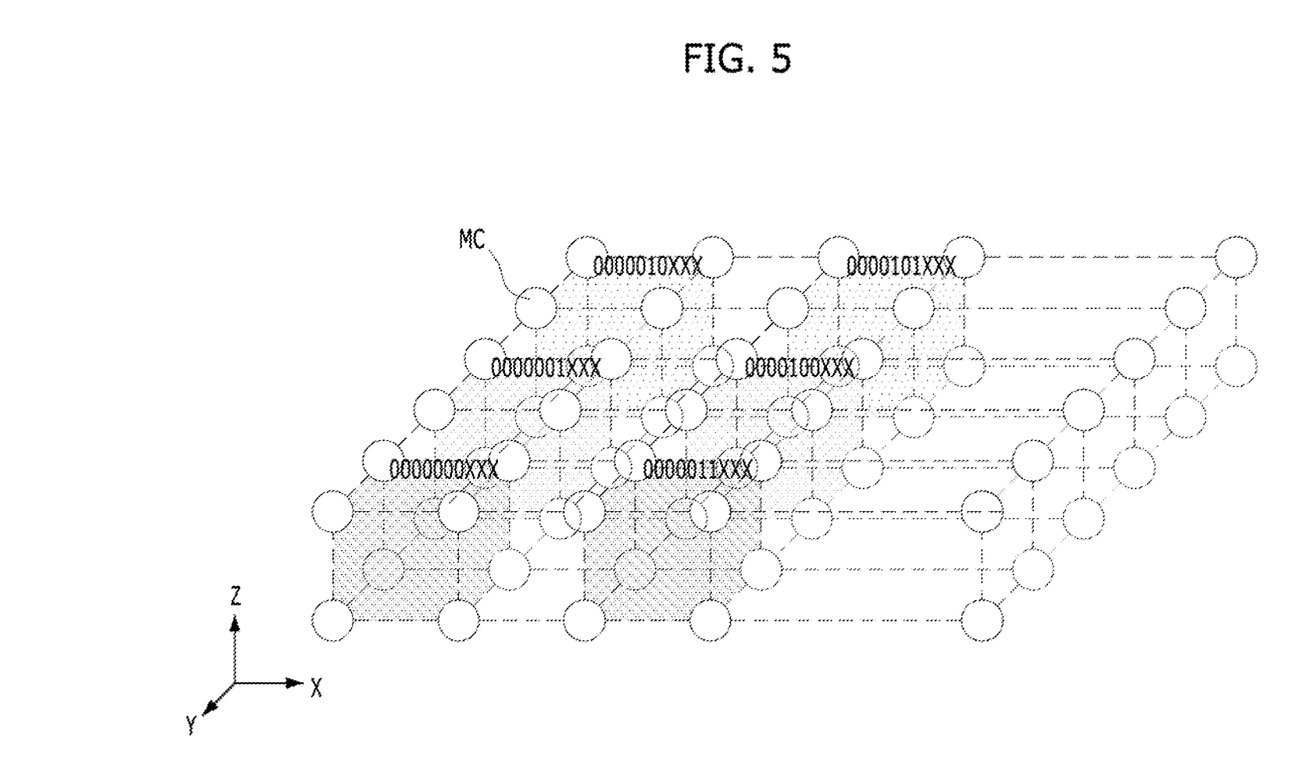
FIG. 5 is a diagram illustrating a first mapping operation of an address mapping module shown in FIG. 4.

FIG. 5 is a diagram illustrating a first mapping operation of an address mapping module in accordance with an embodiment of the present invention, for example, the first mapping operation of the address mapping module 122 of FIG. 4.

Referring to FIG. 5, in the memory cell array of the 3D structure, a plurality of memory cells MC may be respectively located at the intersections between a plurality of word lines (not shown) and a plurality of bit lines (not shown). The plurality of word lines is extended in the X direction, arranged in the Y direction and stacked in the Z direction. The plurality of bit lines is extended in the Y direction and arranged in the X direction between word lines adjacent in the Z direction.

The address mapping module 122 may perform a first mapping operation for grouping memory cells adjacent to each other into a cube unit, from the plurality of memory cells MC, and for allocating MSB N bits of a physical address so that the cubes are identified. In this case, the address mapping module 122 may group memory cells MC that are physically adjacent to each other into one cube. Each of the memory cells MC may be located at the vertex of a corresponding cube. For example, the address mapping module 122 may group some memory cells that belong to the memory cells MC and that are coupled to two bit lines adjacent in the X direction into one cube. More specifically, the address mapping module 122 may group eight memory cells MC, located at the intersections of two bit lines adjacent in the X direction and four word lines adjacent in the Y direction or the Z direction, into one cube.

A number obtained by dividing a total number of memory cells by the number of memory cells within one cube may be smaller than or equal to $2^N$. For example, if a total number of memory cells is 1024 and the number of memory cells within one cube is 8, N may be determined to be 7. Alternatively, if a total number of memory cells is 1048 and the number of memory cells within one cube is 8, N may be determined to be 8.

Likewise, the address mapping module 122 may group adjacent memory cells into a cube unit, and may allocate MSB N bits of a physical address so that the cubes are identified. For example, as shown in FIG. 5, if the number of memory cells within one cube is 8 and N is 7, MSB N bits of a physical address may be allocated to 128 cubes, each of which has any one value among values ranging from "00000000" to "1111111."

Figure 6A:
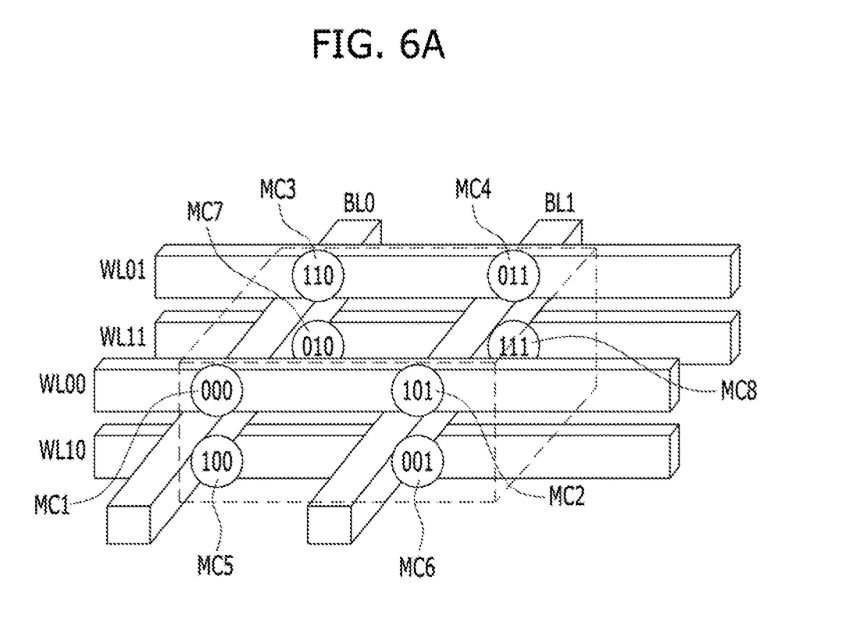
FIGS. 6A and 6B are a diagram and table illustrating a second mapping operation of an address mapping module shown in FIG. 4.
Figure 6B:
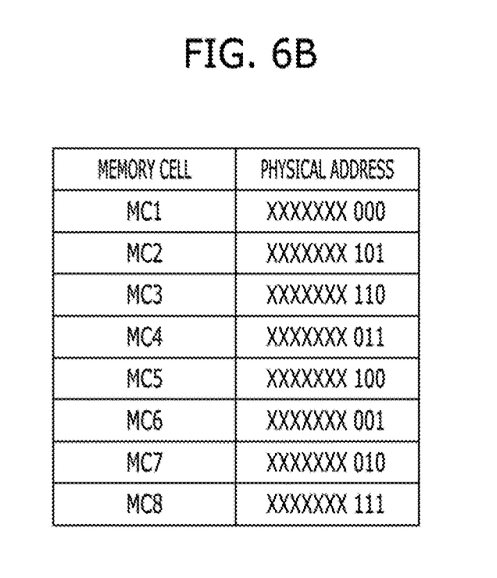

FIGS. 6A and 6B are a diagram and table illustrating a second mapping operation of an address mapping module in accordance with an embodiment of the present invention, for example, the second mapping operation of the address mapping module 122 of FIG. 4, respectively.

FIG. 6A illustrates memory cells included in one cube. If eight memory cells are grouped into one cube, the address mapping module 122 may perform the second mapping operation for allocating LSB 3 bits of a physical address so that memory cells located at the vertexes of one cube are designated to have any one value among values ranging from a value "000" to a value "111."

In this case, the address mapping module 122 may repeatedly perform a process of allocating an initial bit value of "000" to a specific memory cell of the one cube and allocating a bit value of "001" that has been increased by one bit from the initial bit value to a memory cell not coupled to the same word line or bit line as the specific memory cell. That is, the address mapping module 122 may allocate the bit value of "001" to a memory cell that does not share the same word line or bit line as the specific memory cell.

For example, as shown in FIG. 6A, the address mapping module 122 may allocate an initial bit value of "000" to a first memory cell MC1 disposed at the intersection of a first word line WL00 and a first bit line BL0. Next, the address mapping module 122 may allocate a bit value of "001", increased by one bit from the initial bit value, to a memory cell (e.g., a sixth memory cell MC6) not coupled to the same word line (i.e., the first word line WL00) or bit line (i.e., the first bit line BL0) as the first memory cell MC1. Likewise, the address mapping module 122 may allocate a bit value of "010", increased by one bit from the bit value of "001", to a memory cell (e.g., a seventh memory cell MC7) not coupled to the same word line (i.e., a third word line WL10) or bit line (i.e., a second bit line BL1) as the sixth memory cell MC6. The address mapping module 122 may allocate the LSB 3 bits of the physical address that increase from the value "000" to the value "111" to the first to eighth memory cells MC1 to MC8 of each cube, respectively, by repeating the above process as shown in the table of FIG. 6B.

An address mapping method of the memory system is described below with reference to FIGS. 4 to 7.

Figure 7:
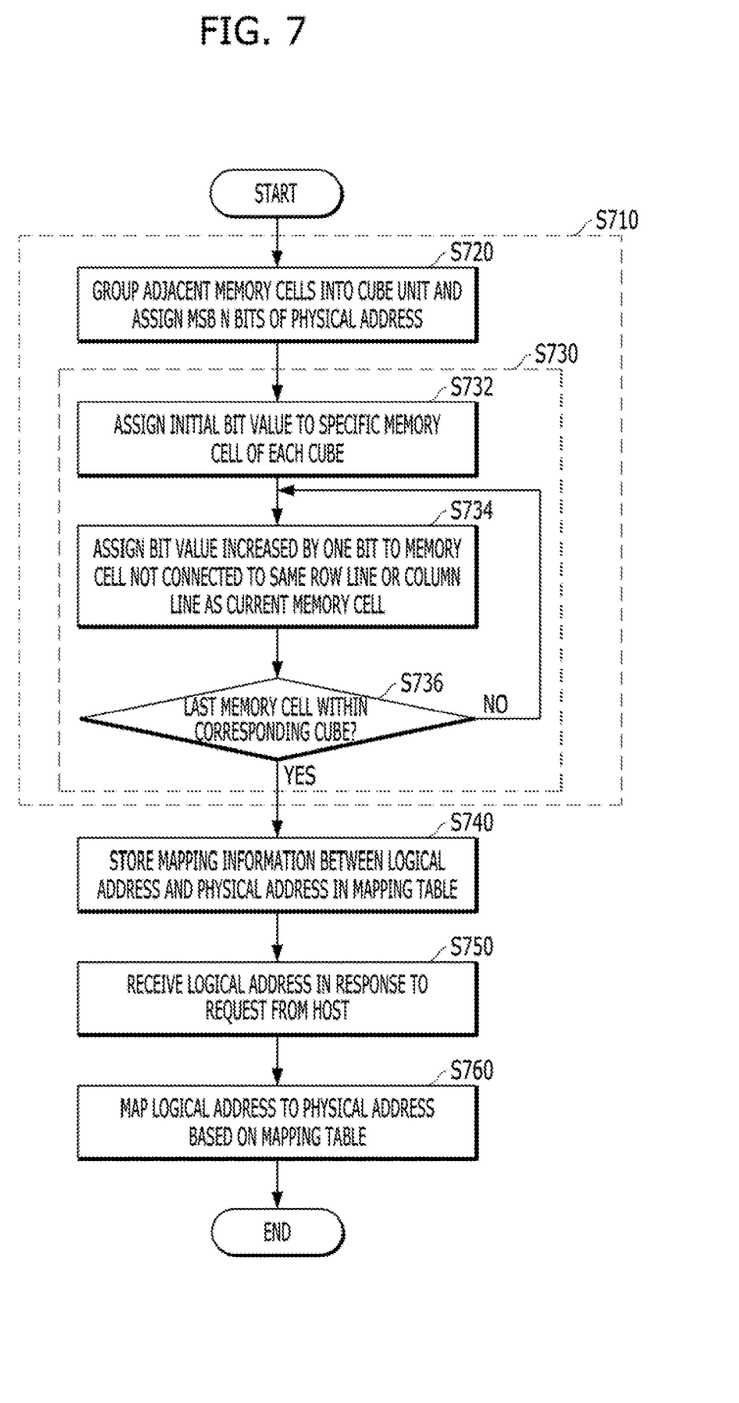
FIG. 7 is a flowchart illustrating an address mapping method in accordance with an embodiment of the present invention.

FIG. 7 is a flowchart illustrating an address mapping method in accordance with an embodiment of the present invention.

Referring to FIG. 7, the controller 100 of the memory system 1200 of FIG. 4 may perform an address mapping operation, at step S710.

More specifically, the address mapping module 122 of the controller 100 may perform the first mapping operation for grouping adjacent memory cells into a cube unit from a plurality of memory cells respectively located at the intersections of a plurality of word lines WL and a plurality of bit lines BL, and for allocating MSB N bits of a physical address PA so that the cubes are identified, at step S720. Contents related to the first mapping operation have been described with reference to FIG. 5, and thus a detailed description thereof is omitted.

Next, the address mapping module 122 may perform the second mapping operation for allocating LSB M bits of the physical address PA so that the locations of memory cells included in each cube are designated, at step S730.

In the second mapping operation, allocating an initial bit value to a specific memory cell of each cube at step S732, and allocating a bit value increased by one bit to a memory cell not coupled to the same word line or bit line as a current memory cell at step S734 may be repeated until the entire physical address is allocated to the last memory cell within a corresponding cube, at step S736. The second mapping operation has been described with reference to FIGS. 6A and 6B, and thus a detailed description thereof is herein omitted.

When the address mapping operation for all of the memory cells of all of the cubes is completed by repeatedly performing the first mapping operation and the second mapping operation, the address mapping module 122 may store information about the mapping of the logical address LA and the (M+N)-bit physical address PA in the AMT 132, at step S740.

Thereafter, when the memory system 1200 receives a logical address LA in response to a request REQ received from the outside (i.e., the host 1100) at step S750, the controller 100 may map the logical address LA, received from the host 1100, to the physical address PA based on the mapping information stored in the AMT 132, and may provide the mapped physical address PA to the memory device 200, at step S760.

Accordingly, the memory device 200 may perform an operation such as a read or write operation according to the request REQ of the host 1100 on memory cells corresponding to the physical address PA.

As described above, in accordance with an embodiment of the present invention, memory cells are grouped in cube units, and MSBs of a physical address are allocated so that the cubes are identified. Furthermore, LSBs of the physical address that are sequentially increased are allocated to memory cells not coupled to the same word line or bit line within each cube. That is, it is not necessary to secure the data recovery time of a previously accessed memory cell in the incremental address decoding scheme because addresses are mapped so that the same word line or the same bit line is not consecutively accessed. Accordingly, the time that is required for accessing a memory cell can be reduced substantially.

In the above embodiment, the address mapping operation has been illustrated as being performed on the controller side. In another embodiment, the address mapping operation may be performed on the memory device side. In this case, the controller may map a logical address to a first physical address in response to a request from the host as in a conventional technology. The memory device may receive the first physical address, and may remap the first physical address to a second physical address based on mapping information obtained by performing the first mapping operation and second mapping operation described with reference to FIGS. 5 to 6B.

A memory device in accordance with another embodiment of the present invention is described below with reference to FIG. 8.

Figure 8:
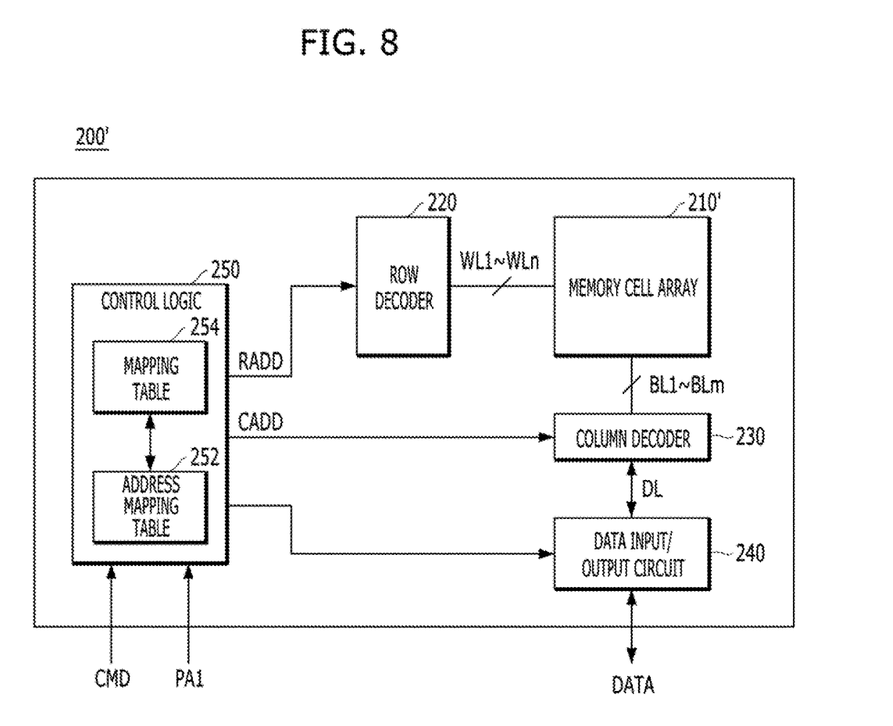
FIG. 8 is a block diagram illustrating a memory device in accordance with an embodiment of the present invention.

FIG. 8 is a block diagram illustrating a memory device 200' in accordance with another embodiment of the present invention.

Referring to FIG. 8, the memory device 200' may include a memory cell array 210', a row decoder 220, a column decoder 230, a data input/output circuit 240 and a control logic 250.

The memory cell array 210' may be coupled to the row decoder 220 through word lines WL1 to WLn and coupled to the column decoder 230 through bit lines BL1 to BLm. The memory cell array 210' of FIG. 8 has substantially the same configuration as the memory cell array 210 of FIG. 4, and thus a detailed description thereof is omitted.

The row decoder 220 may be coupled to the memory cell array 210' through the word lines WL1 to WLn. The row decoder 220 may be configured to operate under the control of the control logic 250. The row decoder 220 may receive a row address RADD from the control logic 250. The row decoder 220 may decode the row address RADD and select one of the word lines WL1 to WLn.

The column decoder 230 may be coupled to the memory cell array 210' through the bit lines BL1 to BLm and coupled to the data input/output circuit 240 through data lines DL. The column decoder 230 may be configured to operate under the control of the control logic 250. The column decoder 230 may receive a column address CADD from the control logic 250. The column decoder 230 may decode the column address CADD and select one of the bit lines BL1 to BLm.

The data input/output circuit 240 may be coupled to the column decoder 230 through the data lines DL. The data input/output circuit 240 may operate under the control of the control logic 250. The data input/output circuit 240 may transmit or receive data DATA to or from the outside. When a program operation is performed, the data input/output circuit 240 may receive program data DATA from the outside and transmit the program data DATA to the memory cell array 210' through the column decoder 230. When a read operation is performed, the data input/output circuit 240 may receive read data DATA from the memory cell array 210' through the column decoder 230 and output the read data DATA to the outside.

The control logic 250 may be coupled to the row decoder 220, the column decoder 230 and the data input/output circuit 240. The control logic 250 may be configured to receive a command CMD through the input/output buffer (not shown) of the memory device 200' and to control an operation of the memory device 200' in response to the command CMD. Furthermore, the control logic 250 may receive an address PA1 through the input/output buffer of the memory device 200', and may transfer the address PA1 to the row decoder 220 and the column decoder 230 as the row address RADD and the column address CADD, respectively. In this case, the address PA1 may include a first physical address PA1 provided by a controller, for example, the controller 100 of FIG. 4.

In an embodiment of the present invention, the control logic 250 may receive the first physical address PA1 from the controller, and may remap the first physical address PA1 as a second physical address PA2 based on mapping information obtained by performing the first mapping operation and the second mapping operation described with reference to FIGS. 5 to 6B. To this end, the control logic 250 may include an address mapping module 252 and a mapping table 254.

The address mapping module 252 may group adjacent memory cells from a plurality of memory cells into a cube unit, may allocate MSB N bits of the second physical address PA2 so that the cubes are identified, and may allocate LSB M bits of the second physical address PA2 so that the locations of memory cells included in each cube are designated. The address mapping module 252 of FIG. 8 has substantially the same configuration as the address mapping module 122 of FIG. 4, and thus a detailed description thereof is omitted.

The mapping table 254 may store information about the mapping of the first physical address PA1 and the second physical address PA2. The mapping table 254 of FIG. 8 has substantially the same configuration as the AMT 132 of the memory 130 shown in FIG. 4, and thus a detailed description thereof is omitted. Alternatively, the mapping table 254 may be disposed outside the control logic 250.

As described above, in accordance with another embodiment of the present invention, the controller may map a logical address to a first physical address in response to a request received from the host. The memory device 200' may receive the first physical address and remap the first physical address to a second physical address based on mapping information obtained by performing the first mapping operation and second mapping operation described with reference to FIGS. 5 to 6B. Accordingly, the time that is taken for the access operation of a memory cell can be reduced because addresses are mapped so that the same word line or the same bit line is not consecutively accessed.

The memory system according to an embodiment of the present invention has an advantage in that it can reduce the time taken for the access operation of a memory cell by efficiently performing address mapping on a memory cell.

Although various embodiments have been described for illustrative purposes, it will be apparent to those skilled in the art that various changes and modifications may be made without departing from the spirit and scope of the invention as defined in the following claims.

What is claimed is:

1. An address mapping method of a memory system, comprising:
    grouping adjacent memory cells into multiple cubes, from a plurality of memory cells respectively located at intersections of a plurality of row lines and a plurality of column lines;
    allocating most significant bit (MSB) N bits of a physical address for identifying the cubes;
    allocating least significant bit (LSB) M bits of the physical address for designating locations of memory cells included in each of the cubes, M and N being positive integers;
    storing information about a mapping between a logical address and an (M+N)-bit physical address in a mapping table; and
    when the logical address in response to an external request is received, translating the logical address to the physical address based on the mapping table.

2. The address mapping method of claim 1, wherein a number obtained by dividing a total number of the memory cells by a number of memory cells within each cube is smaller than or equal to $2^N$.

3. The address mapping method of claim 1, wherein a number of memory cells within one cube is smaller than or equal to $2^M$.

4. The address mapping method of claim 1, wherein M is a positive integer greater than or equal to 3.

5. The address mapping method of claim 1, wherein
    the plurality of row lines is extended in a first direction, arranged in a second direction and stacked in a third direction, and
    the plurality of column lines is extended in the second direction between row lines adjacent in the third direction and arranged in the first direction.

6. The address mapping method of claim 5, wherein some of the memory cells coupled to two column lines adjacent in the first direction are grouped into one cube.

7. The address mapping method of claim 5, wherein eight memory cells located at intersections of two column lines adjacent in the first direction and four row lines adjacent in the second direction or the third direction are grouped into one cube.

8. The address mapping method of claim 1, wherein the allocating of the LSB M bits of the physical address comprises:
    allocating an initial bit value to a specific memory cell of each cube; and
    allocating a bit value increased by one bit from the initial bit value to a memory cell not coupled to a row line or column line identical with a row line or column line of the specific memory cell.

9. A memory system comprising:
    a controller suitable for translating a logical address to an (M+N)-bit physical address based on mapping information, M and N being positive integers; and
    a memory device including a plurality of memory cells respectively located at intersections of a plurality of row lines and a plurality of column lines, suitable for performing a read/write operation on memory cells corresponding to the physical address,
    wherein the controller comprises:
        an address mapping module suitable for grouping adjacent memory cells from the plurality of memory cells into multiple cubes, allocating most significant bit (MSB) N bits of the physical address for identifying the cubes, and allocating least significant bit (LSB) M bits of the physical address for designating locations of memory cells included in each cube; and
        a mapping table suitable for storing the mapping information between the logical address and the physical address.

10. The memory system of claim 9, wherein
    the plurality of row lines is extended in a first direction, arranged in a second direction and stacked in a third direction, and
    the plurality of column lines is extended in the second direction between row lines adjacent in the third direction and arranged in the first direction.

11. The memory system of claim 10, wherein the address mapping module is suitable for grouping some of the memory cells coupled to two column lines adjacent in the first direction into one cube.

12. The memory system of claim 10, wherein the address mapping module is suitable for grouping eight memory cells located at intersections of two column lines adjacent in the first direction and four row lines adjacent in the second direction or the third direction into one cube.

13. The memory system of claim 9, wherein the address mapping module is suitable for allocating the LSB M bits of the physical address by allocating an initial bit value to a specific memory cell of each cube and by allocating a bit value increased by one bit from the initial bit value to a memory cell not coupled to a row line or column line identical with a row line or column line of the specific memory cell.

14. The memory system of claim 9, wherein the memory device comprises at least one phase-change random access memory (PRAM).

15. A memory system comprising:
    a controller suitable for translating a logical address to a first physical address; and
    a memory device including a plurality of memory cells respectively located at intersections of a plurality of row lines and a plurality of column lines, suitable for remapping the first physical address to a second physical address based on mapping information, and performing a read/write operation on memory cells among the plurality of memory cells corresponding to the second physical address,
    wherein the memory device comprises:
        an address mapping module suitable for grouping adjacent memory cells from the plurality of memory cells into multiple cubes, allocating most significant bit (MSB) N bits of the second physical address for identifying the cubes, and allocating least significant bit (LSB) M bits of the second physical address for designating locations of memory cells included in each cube; and
        a mapping table suitable for storing the mapping information between a first logical address and the second physical address.

16. The memory system of claim 15, wherein
    the plurality of row lines is extended in a first direction, arranged in a second direction and stacked in a third direction, and
    the plurality of column lines is extended in the second direction between row lines adjacent in the third direction and arranged in the first direction.

17. The memory system of claim 16, wherein the address mapping module is suitable for grouping some of the memory cells coupled to two column lines adjacent in the first direction into one cube.

18. The memory system of claim 16, wherein the address mapping module is suitable for grouping eight memory cells located at intersections of two column lines adjacent in the first direction and four row lines adjacent in the second direction or the third direction into one cube.

19. The memory system of claim 15, wherein the address mapping module is suitable for allocating the LSB M bits of the second physical address by allocating an initial bit value to a specific memory cell of each cube and by allocating a bit value increased by one bit from the initial bit value to a memory cell not coupled to a row line or column line identical with a row line or column line of the specific memory cell.

20. The memory system of claim 15, wherein the memory device comprises at least one phase-change random access memory (PRAM).

\* \* \* \* \*